(12) United States Patent
Joyce et al.

(10) Patent No.: US 6,315,586 B1
(45) Date of Patent: Nov. 13, 2001

(54) CARD ACTUATOR

(75) Inventors: Frank W. Joyce; Brian Wilk, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/750,415

(22) Filed: Dec. 27, 2000

(51) Int. Cl.[7] .................................................. H01R 13/62

(52) U.S. Cl. ......................... 439/157; 439/64; 439/160; 439/377

(58) Field of Search ................................ 439/157, 152, 439/155, 159, 160, 64, 377, 629; 361/798

(56) References Cited

U.S. PATENT DOCUMENTS

| | | | |
|---|---|---|---|
| 5,644,470 | * | 7/1997 | Benedict et al. ..................... 439/160 |
| 5,657,204 | * | 8/1997 | Hunt ....................................... 439/64 |
| 5,967,824 | * | 10/1999 | Neal et al. ............................. 439/157 |
| 6,171,120 | * | 1/2001 | Bolich et al. ......................... 439/157 |

* cited by examiner

*Primary Examiner*—Tho D. Ta
(74) *Attorney, Agent, or Firm*—Robert G. Winkle

(57) ABSTRACT

A computer assembly card actuator for inserting peripheral cards into slots on a motherboard. The card actuator is capable of imparting a sufficient and even force to seat the peripheral card in the slot without imparting a residual force after the peripheral card has been seated, which reduces the likelihood of damage to the peripheral card and/or the motherboard.

23 Claims, 12 Drawing Sheets

CARD ACTUATOR

BACKGROUND OF THE INVENTION

1. Field of the Invention

The present invention relates to apparatus and processes for inserting a peripheral card into a slot on a substrate. In particular, the present invention relates to an actuator that imparts a sufficient and even force on a peripheral card to seat it in a slot with no residual force after the peripheral card has been seated.

2. State of the Art

In the assembly of computer devices, such as personal computers, servers, and the like, optional devices are generally attached to primary functional components of the computer device by means of peripheral cards inserted into slots mounted on a main substrate with carries the primary functional components. The main substrate is generally referred to as the "motherboard". The primary functional components may include, but are not limited to, a central processing unit (e.g., CPU or microprocessor), memory (e.g., DRAM, SRAM, DDRAM, etc.), signal buses, system controllers, etc.

As shown in FIG. 11, a slot 202 is electrically attached to a motherboard 200 (generally planar extending perpendicular to FIG. 11). The slot 202 includes electrical contacts 204 within a recess 206 in the slot 202 (shown in the "cut away" portion of the slot 202). The slot electrical contacts 204 are electrical coupled to specific traces (not shown) within or on the motherboard 200. The peripheral card 210 includes a tab portion 212, which has electrical contacts 214 that are positioned to make electrical contact with the slot electrical contacts 204. The peripheral card electrical contacts 214 may be electrically coupled to components 216 (mounted on the peripheral card 210 and shown in shadow lines) through traces (not shown). The peripheral card 210 may include a mounting bracket 218 that can be affixed to a computer chassis (not shown).

As shown in FIG. 12, electrical contact between the peripheral card 210 and the motherboard 200 is accomplished by seating the peripheral card tab portion 212 in the slot 202. This is accomplished by pressing on the peripheral card 210 in direction 220 generally by a person, either by hand or with the assistance of a pneumatic press (not shown). However, both methods may result in pressure being exerted on the peripheral card 210 after it has been properly seated in the slot 202, which may result in damage to the peripheral card 210 and/or the motherboard 200. The risk of damage is also increased if an uneven pressure is exerted on the peripheral card 210.

Therefore, it would be advantageous to develop an apparatus and technique to seat a peripheral card into a slot, while lessening or eliminating the potential of damaging the motherboard or the peripheral card.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
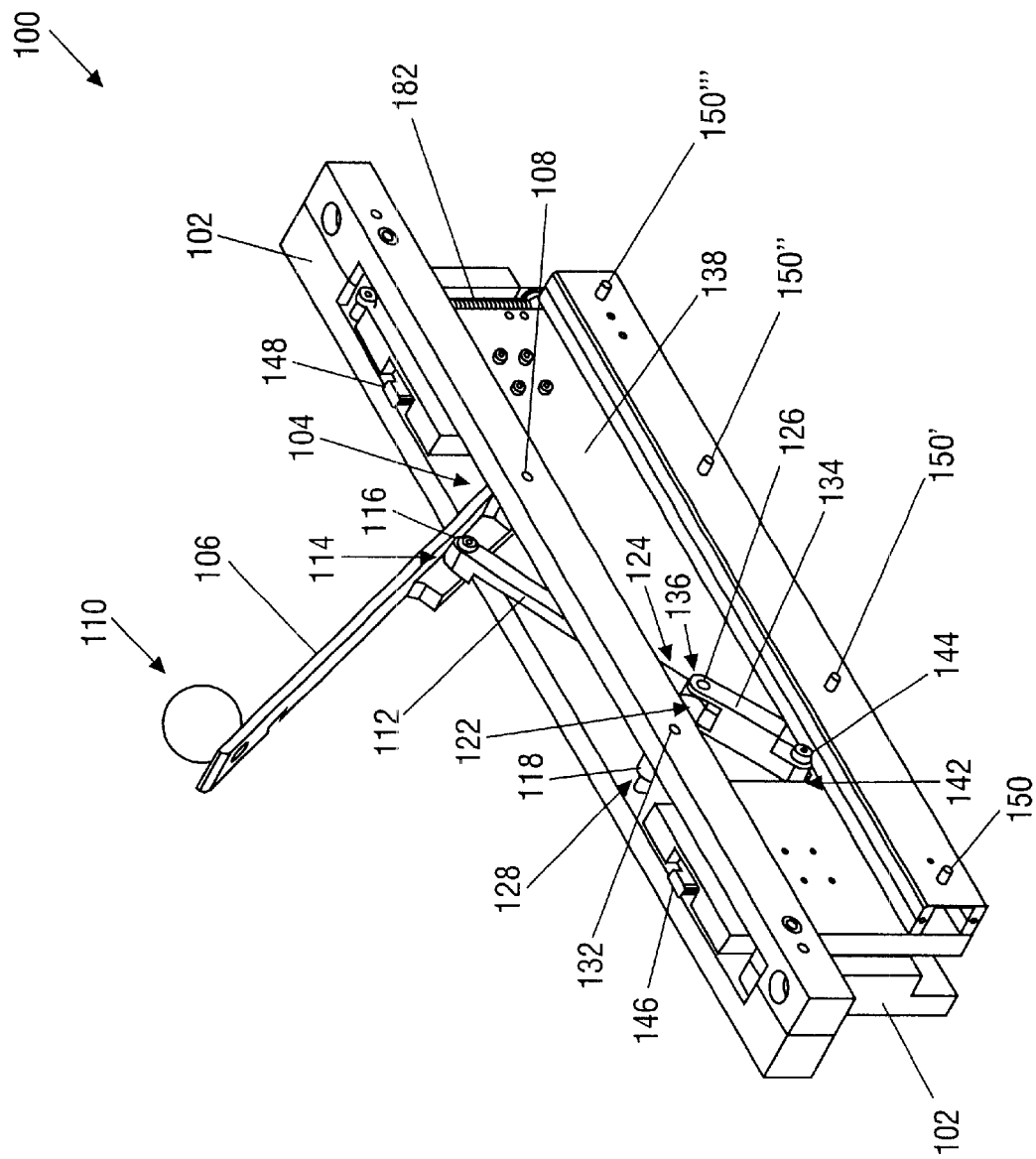
FIG. 1 is an oblique view of a card actuator in an open position, according to the present invention.

In the following detailed description, reference is made to the accompanying drawings that show, by way of illustration, specific embodiments in which the invention may be practiced. These embodiments are described in sufficient detail to enable those skilled in the art to practice the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a computer assembly card actuator for inserting peripheral or expansion cards into slots on a motherboard. The peripheral cards may include, but are not limited to, video cards, internal modems, sound cards, and microprocessor cartridges. The slots may include, but are not limited to, PCI (Peripheral Component Interconnect) slots, ISA (Industry Standard Architecture) slots, and AGP (Accelerated Graphics Port) slots. The present invention is capable of imparting a sufficient and even force to seat the peripheral card in the slot without imparting a residual force after the peripheral card has been seated which reduces the likelihood of damage to the peripheral card and/or the motherboard. The present invention cain also generate up to 1000 lbs. force with less that 10 lbs. force being exerted by the operator.

Figure 2:
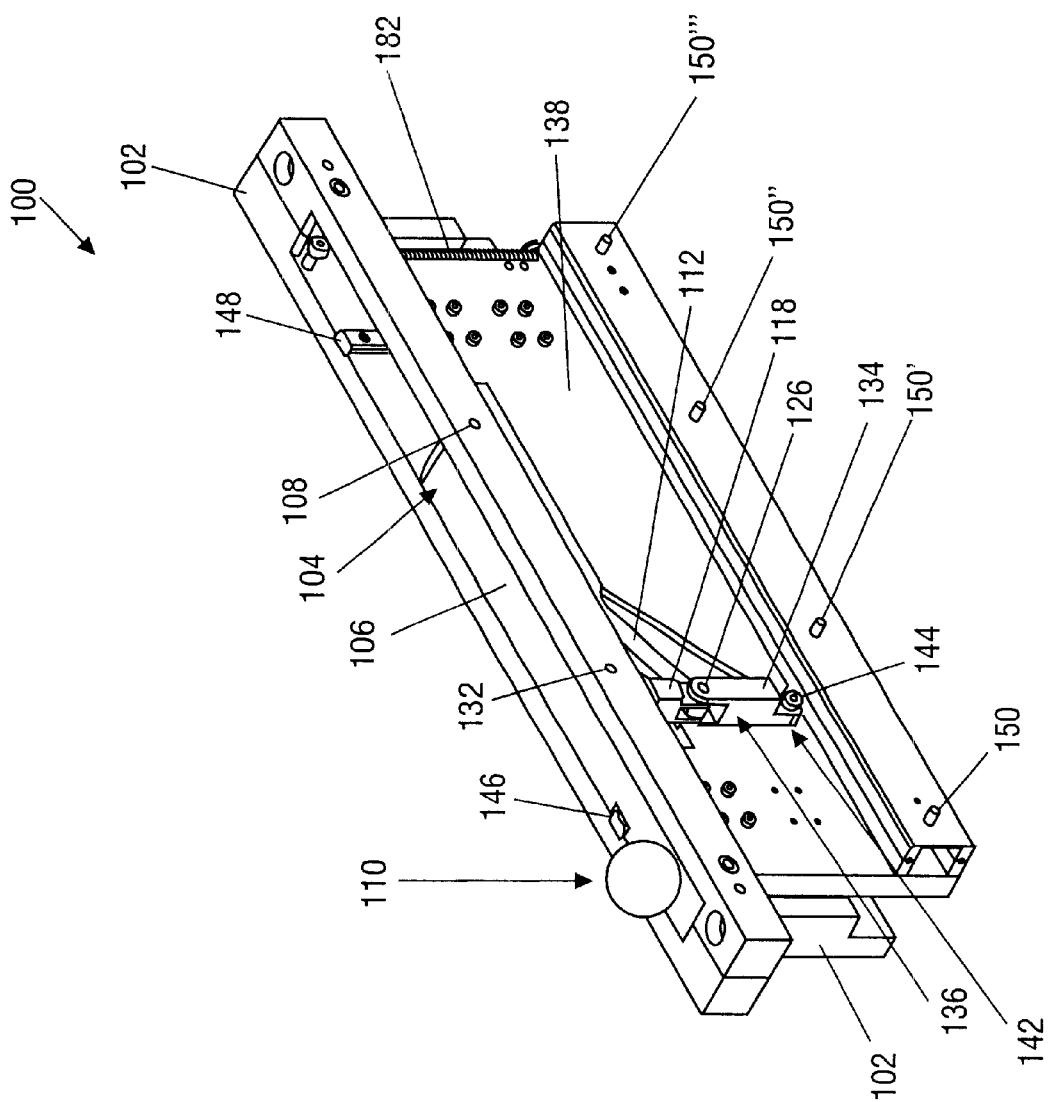
FIG. 2 is an oblique view of the card actuator in a closed position, according to the present invention.
Figure 3:
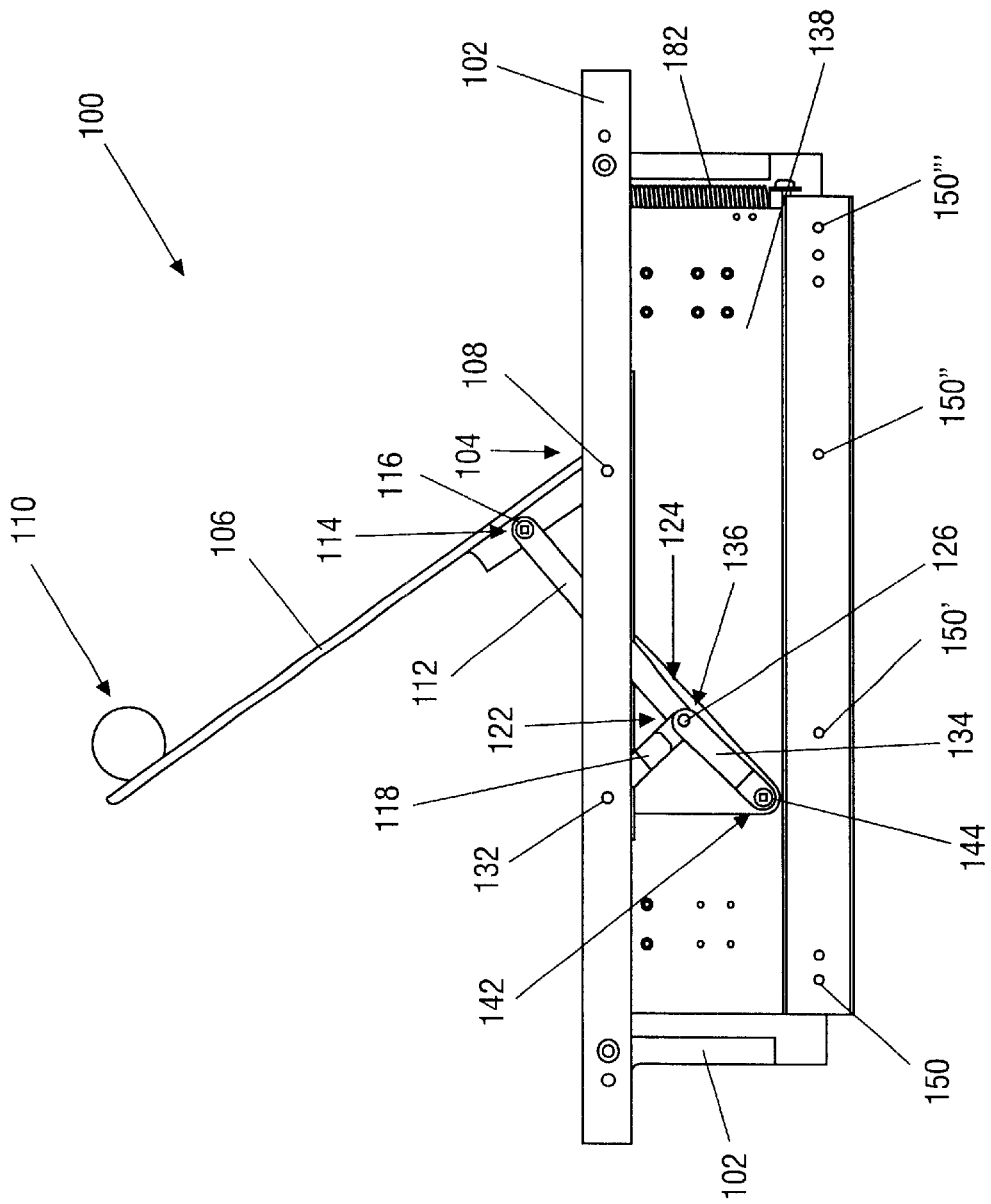
FIG. 3 is a side plan view of the card actuator in an open position, according to the present invention.
Figure 4:
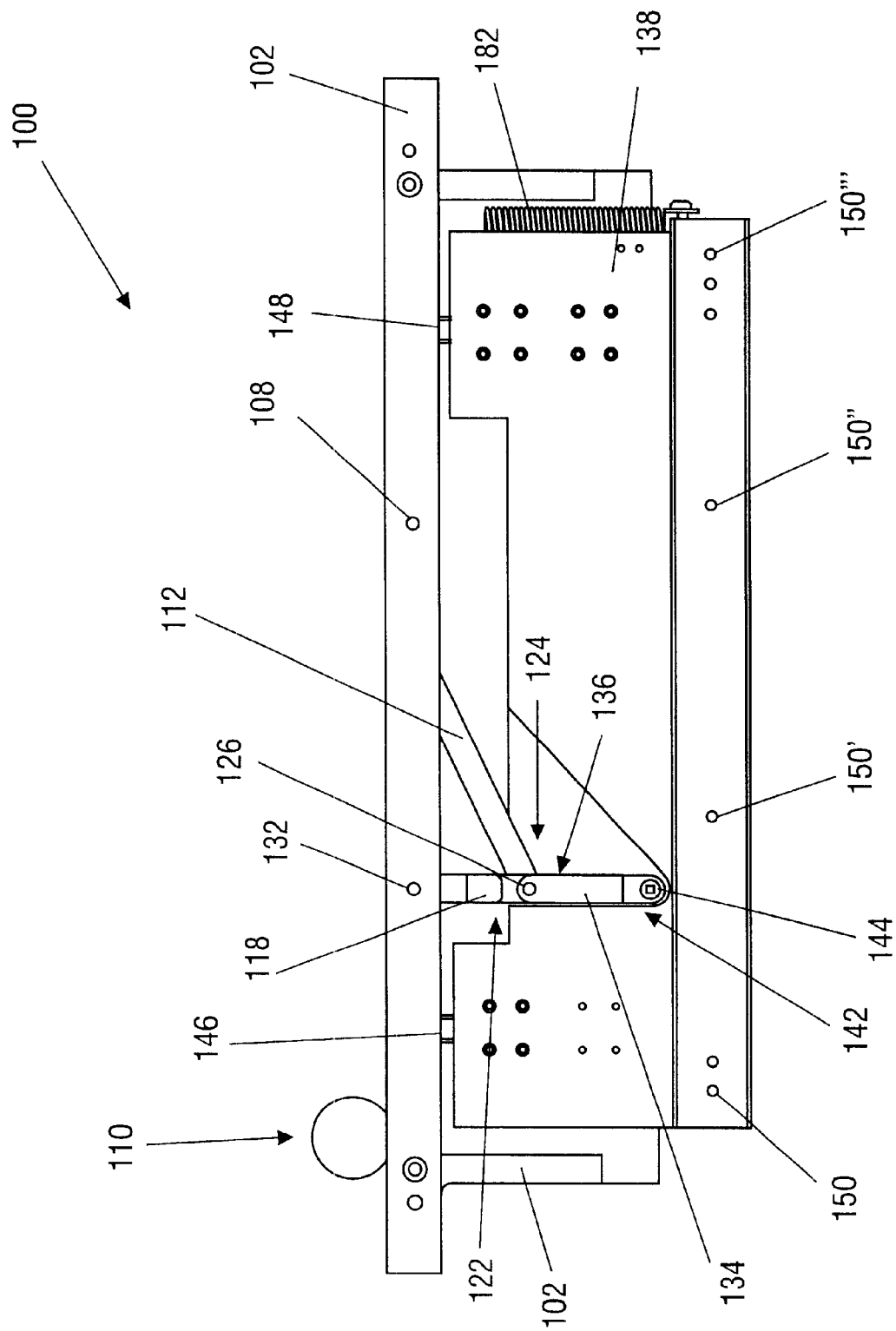
FIG. 4 is a side plan view of the card actuator in a closed position, according to the present invention.
Figure 5:
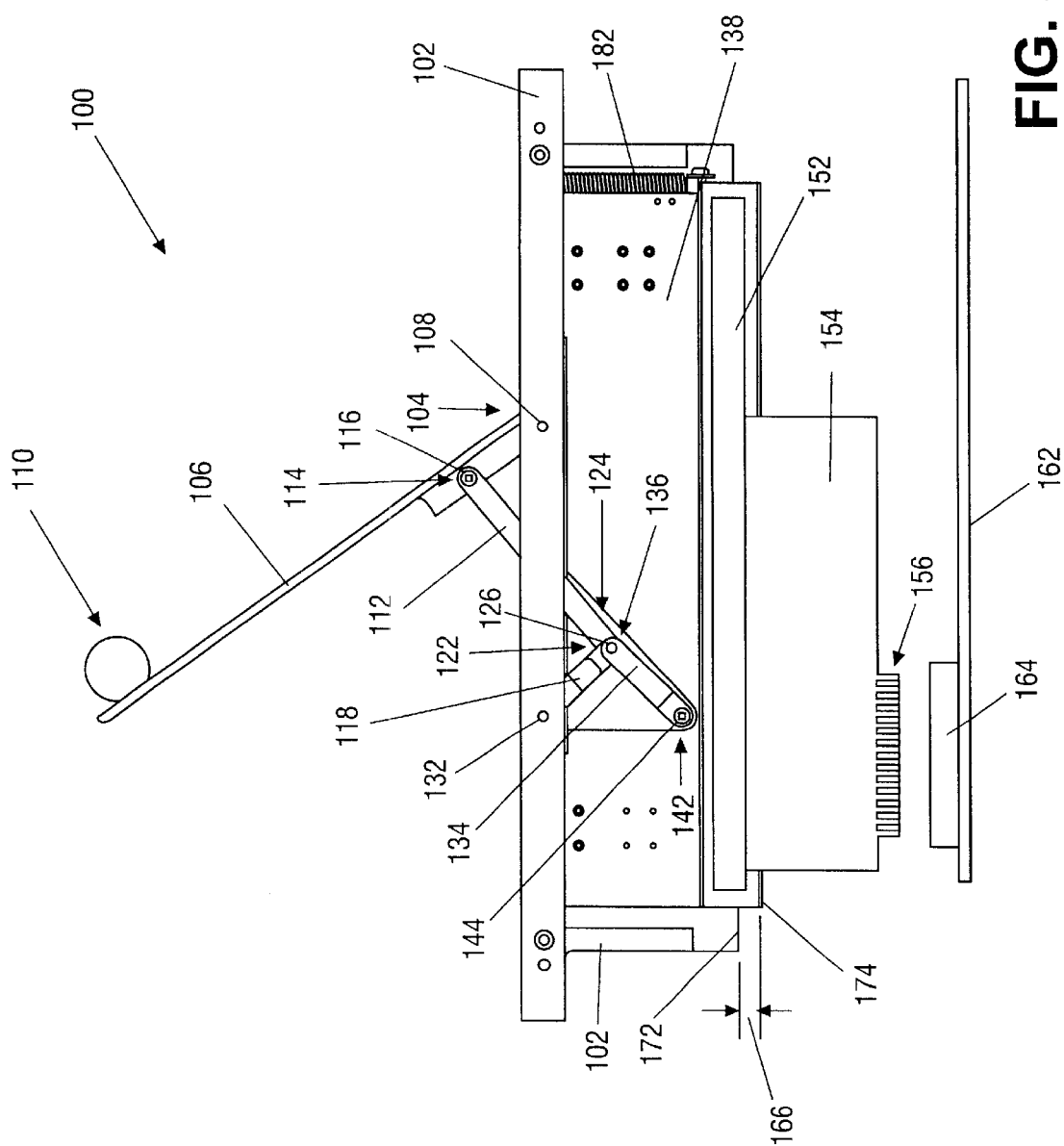
FIG. 5 is a side plan view of the card actuator in an open position with a peripheral card attached thereto, according to the present invention.
Figure 6:
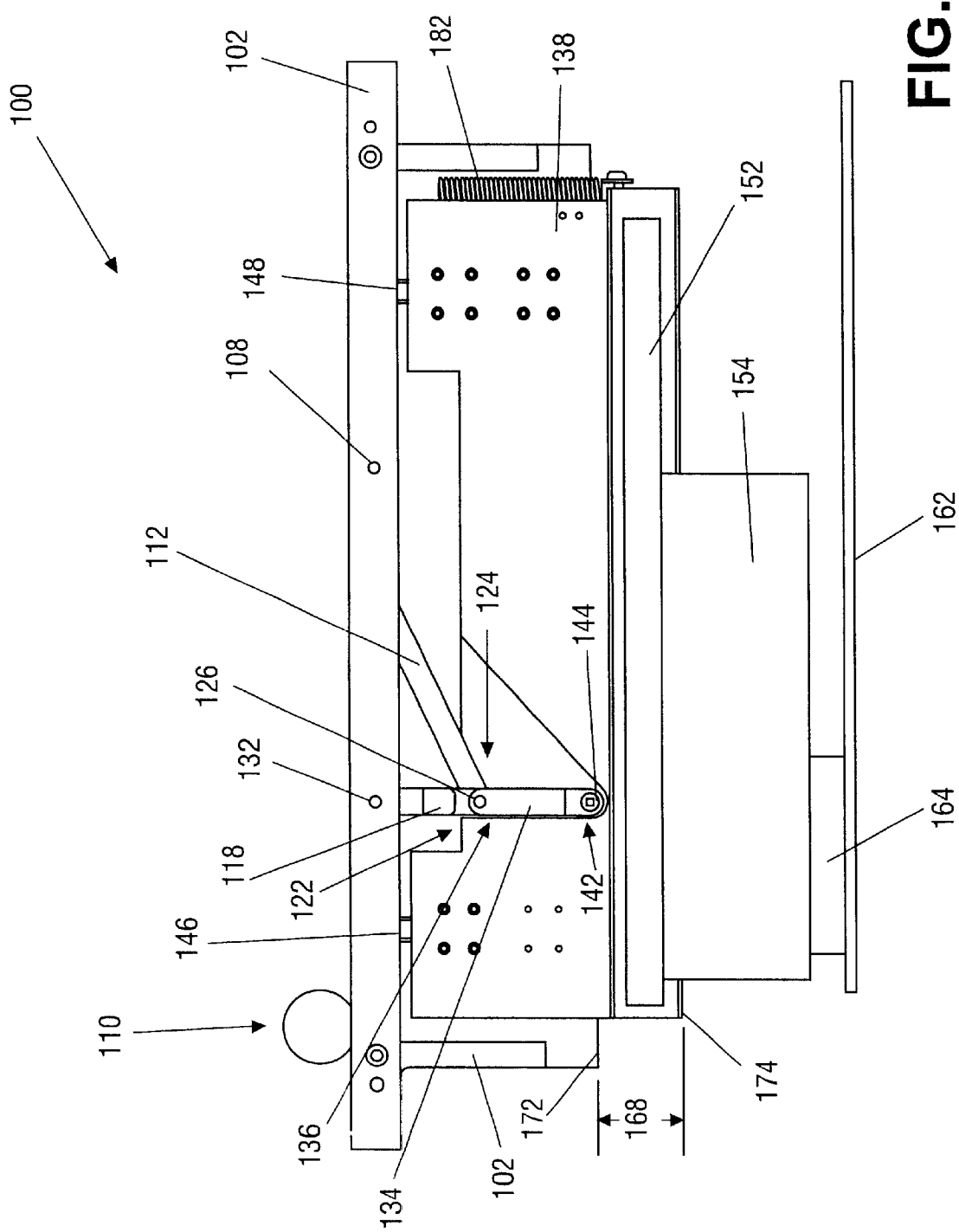
FIG. 6 is a side plan view of the card actuator in a closed position with a peripheral card attached thereto, according to the present invention.

FIGS. 1–6 illustrates a card actuator 100 of the present invention. The card actuator 100 comprises a housing 102 with a first end 104 of a lever arm 106 pivotally attached to the housing 102, such as by first pivot pin 108. When a force 110 is placed on the lever arm 106 to bring it from an open position shown in FIGS. 1, 3, and 5 to a closed position shown in FIGS. 2, 4, and 6, a first rod 112 (which is pivotally attached to the level arm 106 at a first end 114, such as by a second pivot pin 116) imparts a force on a second rod 118 (which is pivotally attached by a first end 122 to a second end 124 of the first rod 112, such as by a third pivot pin 126, and pivotally attached by a second end 128 to the housing 102, such as by a fourth pivot pin 132) and on a third rod 134 (which is pivotally attached by a first end 136 to the first rod second end 124, such as by a third pivot pin 126 shared with the second rod first end 122, and by a second end 142 to a movable frame 138, such as by fifth pivot pin 144). The movable frame 138 engages the housing 102 and slides along guides 146 and 148. When the card actuator 100 is in a closed position as shown in FIGS. 2, 4, and 6, the second rod 118 and the third rod 134 are full extended (in line with one another) and no further force is translated to the movable frame 138. Thus, the movable frame 138 stops its movement.

The movable frame 138 may include at least one mounting mechanism 150, 150', 150",and 150''' (shown in FIGS. 1–4) which are used to attach a peripheral card retainer 152 (see FIGS. 5 and 6). FIGS. 5 and 6 illustrate the peripheral card retainer 152 attached to the movable frame 138 and a peripheral card 154 attached to the peripheral card retainer 152. The peripheral card retainer 152 may have a variety of configurations in order to attach a variety of peripheral card configurations. Each peripheral card retainer 152 is preferably designed to be easily removed in order to conveniently switch between different peripheral card retainer configurations. Further, the peripheral card retainer 152 is designed to quickly engage and disengage the peripheral card 154.

The card actuator 100 is preferably mounted to a frame (not shown) under which a motherboard 162 can be aligned to place a slot 164 thereon directly under a tab portion 156 of the peripheral card 154, while the card actuator 100 in an open position, as shown in FIG. 5. A force 110 is then placed on the lever arm 106 to bring the card actuator 100 into a closed position, as shown in FIG. 6. The distance of travel of the movable frame 138 is the differential of an offset 166 between a bottom portion 172 of the housing 102 and a bottom portion 174 of the movable frame 138 in an open position (see FIG. 5) and an offset 168 between the housing bottom portion 172 and the movable frame bottom portion 174 in a closed position (see FIG. 6). The distance of travel is calibrated to allow the peripheral card tab portion 156 to be correctly seated into the slot 164, wherein at the end of the action (closed position), the force on the peripheral card 154 is substantially zero. This results in no excessive or continuous force being imparted on the peripheral card 154 and/or the motherboard 162, which will greatly lessen or eliminate the potential for damage of either.

Once the peripheral card 154 is seated, it is disengaged from the peripheral card retainer 152 and the force 110 on the level arm 106 is released. When the force 110 on the lever arm 106 is released, a spring 182 attached to said housing 102 and said movable frame 138 brings the movable frame 138 back to its original, open position which, in turn, returns the first rod 112, the second rod 118, the third rod 134, and lever arm 106 to their original open positions, as shown in FIGS. 1, 3, and 5. In other words, the spring 182 biases the movable frame toward said housing 102.

Furthermore, altering the lengths of the first rod 112, the second rod 118, and the third rod 134 can easily modify the force imparted by card actuator 100. This also allows the lever arm 106 to only require about 10 lbs. force or less to bring the card actuator 100 to a closed position, which is within acceptable ergonomic parameters for an operator.

Figure 7:
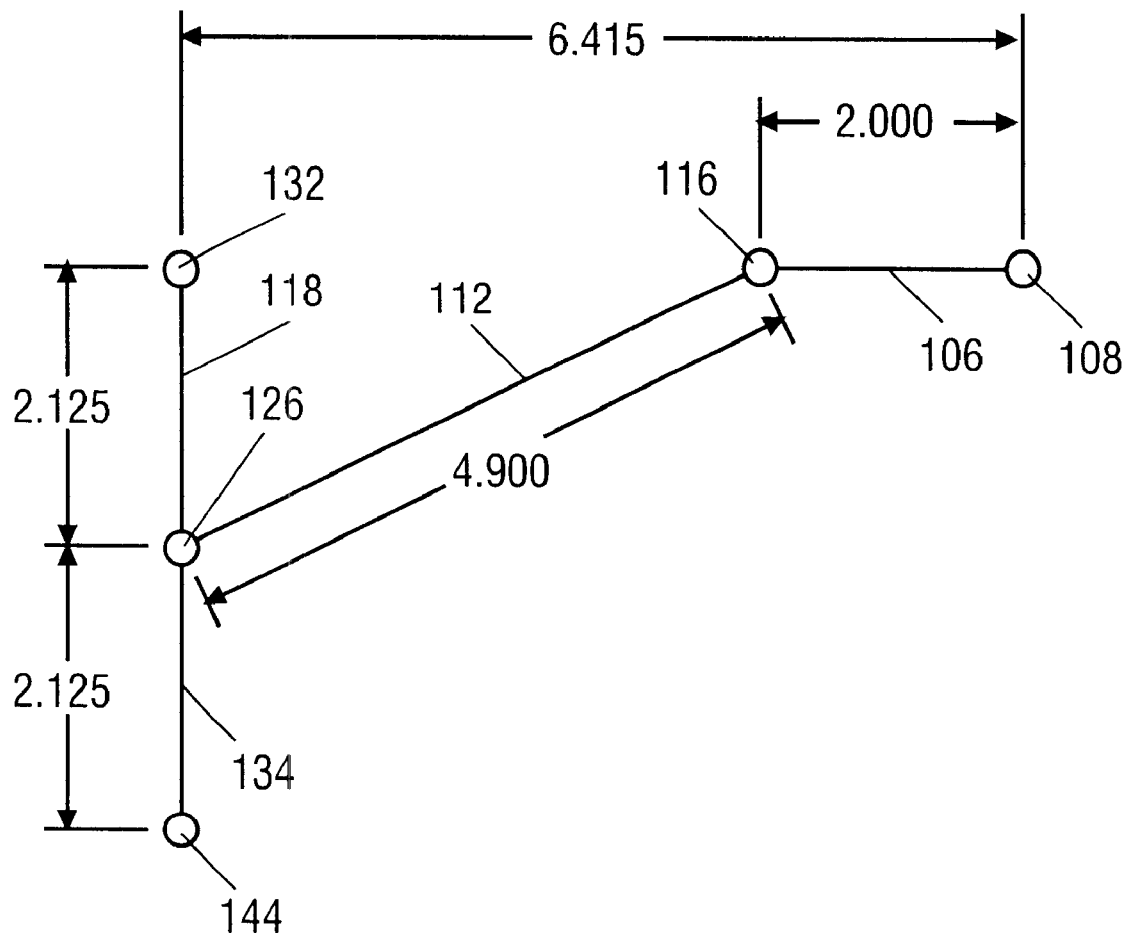
FIG. 7 is a side schematic illustrating the lengths of the rods and a portion of the lever arm of the card actuator, according to the present invention.

FIGS. 7–10 illustrate schematics for the operation of the rods and a portion of the lever arm of the card actuator. FIG. 7 illustrates exemplary dimensions of the present invention wherein the card actuator is in a close position. The length of a portion of the lever arm 106 between the first pivot pin 108 and the second pivot pin 116 is about 2 inches. The length of the first rod 112 from the second pivot pin 116 to the third pivot pin 126 is about 4.9 inches. The length of the second rod 118 between the third pivot pin 126 and the fourth pivot pin 132 is about 2.125 inches. The length of the third rod 134 between the third pivot pin 126 and the fifth pivot pin 144 is about 2.125 inches. The distance between the first pivot pin 108 and the fourth pivot pin 132 is about 6.415 inches.

Figure 8:
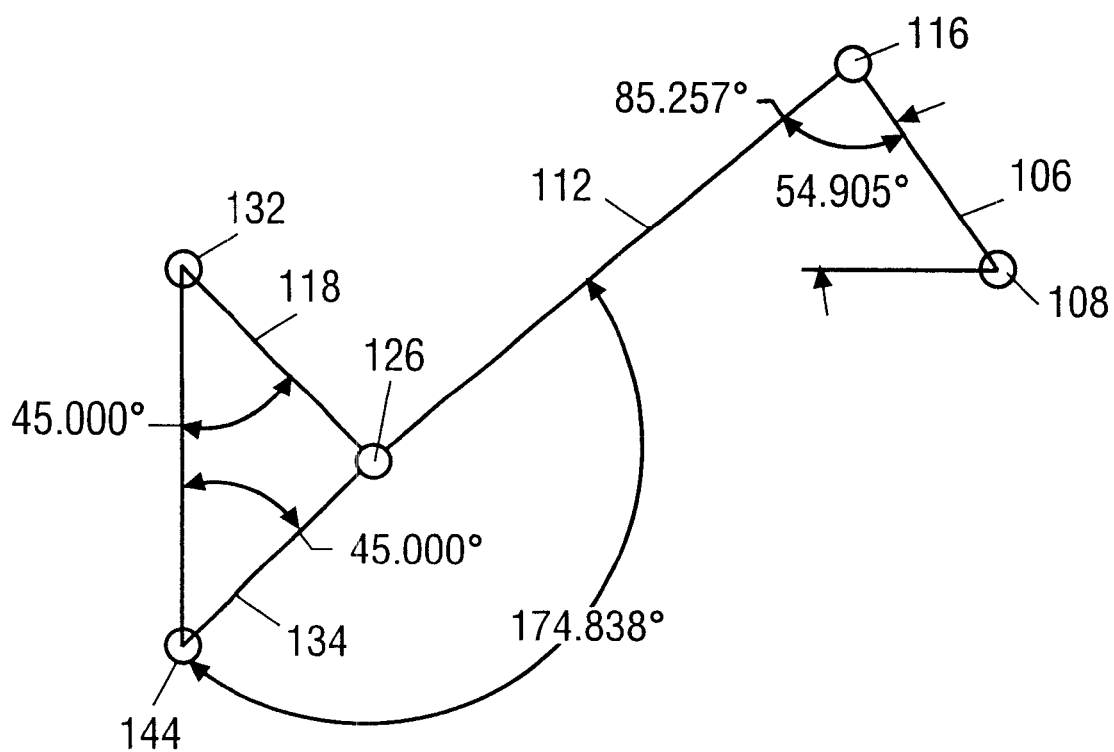
FIG. 8 is a side schematic illustrating the rods and a portion of the lever arm of the card actuator in an open position, according to the present invention.

FIG. 8 illustrates exemplary angles for the rods and lever arm when the card actuator is in an open position. The angle between the lever aim 106 in an open position and a closed position is about 54.905 degrees. The angle between the lever arm 106 and the first rod 112 is about 85.257 degrees. The angle between the first rod 112 and the third rod 134 is about 174.838 degrees. The angle between the second rod 118 in an open position and a closed position is about 45 degrees. The angle between the third rod 134 in an open position and a closed position is about 45 degrees.

Figure 9:
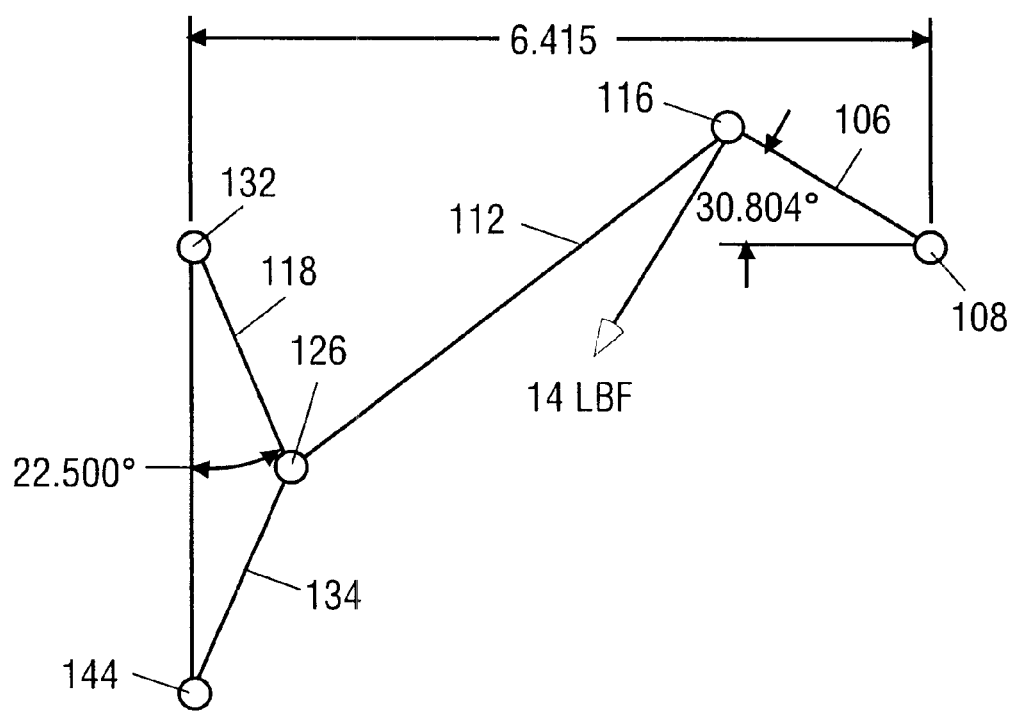
FIG. 9 is a side schematic illustrating the rods and a portion of the lever arm of the card actuator halfway between an open and a closed position, according to the present invention.

FIG. 9 illustrates a schematic of the card actuator about halfway between an open and a closed position. The angle between the lever arm 106 in the halfway position and a closed position is about 30.804 degrees. The angle between the second rod 118 in the halfway position and the closed position is about 22.5 degrees (i.e., halfway between an open and closed position). The force that is being translated to a peripheral card may be estimated by the following equations:

$$Fx = \text{force input}/\sin(a)$$

wherein: a=angle between the lever arm in the halfway position and the closed position $$Fy = Fx/\sin(t)$$

wherein: t=angle between the second rod in an open position and a closed position $$Fy = (\text{force input}/\sin(a))/\sin(t)$$

Thus, for a force input on second pivot point 116 of 14 $lb_f$ perpendicular to the lever arm 106, an angle "a" of 30.8 degrees, and an angle "t" of 22.5 degrees:

Fy=(14 $lb_f$/sin (30.8 degrees))/sin (22.5 degrees)

Fy=75 $lb_f$

Thus, 75 $lb_f$ would be imparted on a peripheral card to seat it in a slot at the halfway point.

Figure 10:
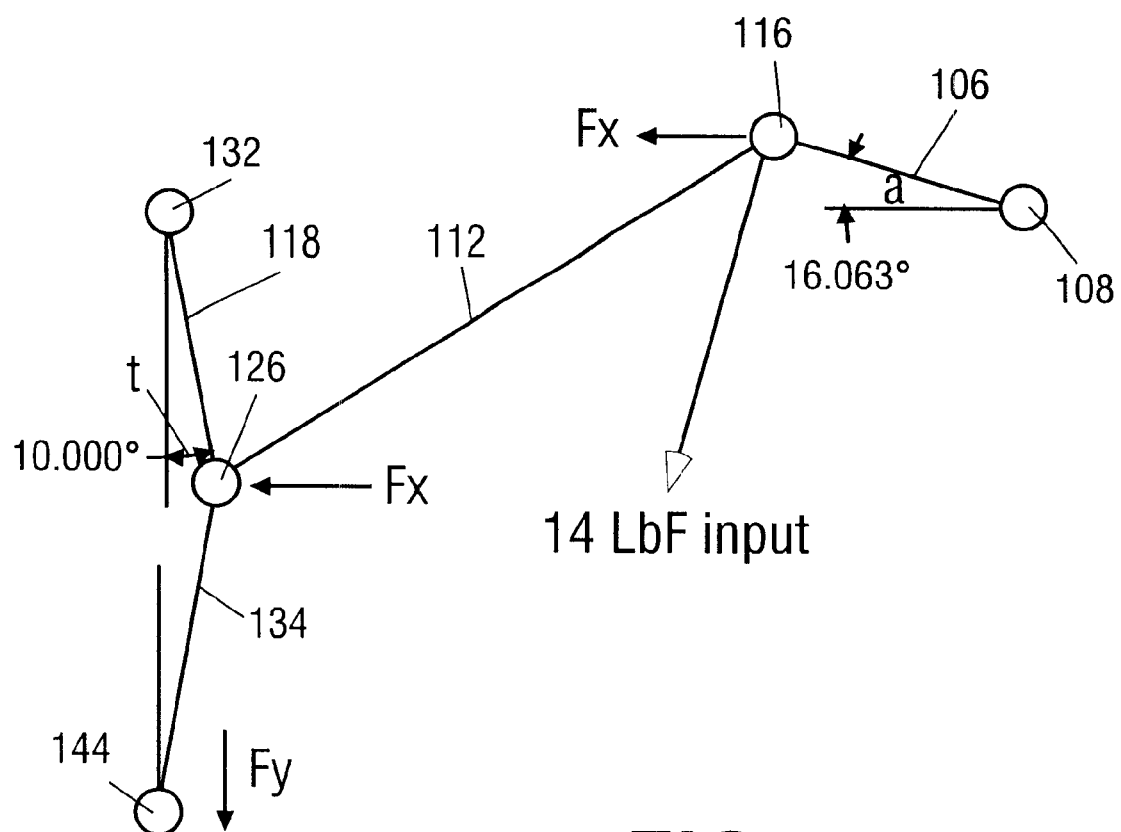
FIG. 10 is a side schematic illustrating the rods and a portion of the lever arm of the card actuator just before coming to a closed position, according to the present invention.
Figure 11:
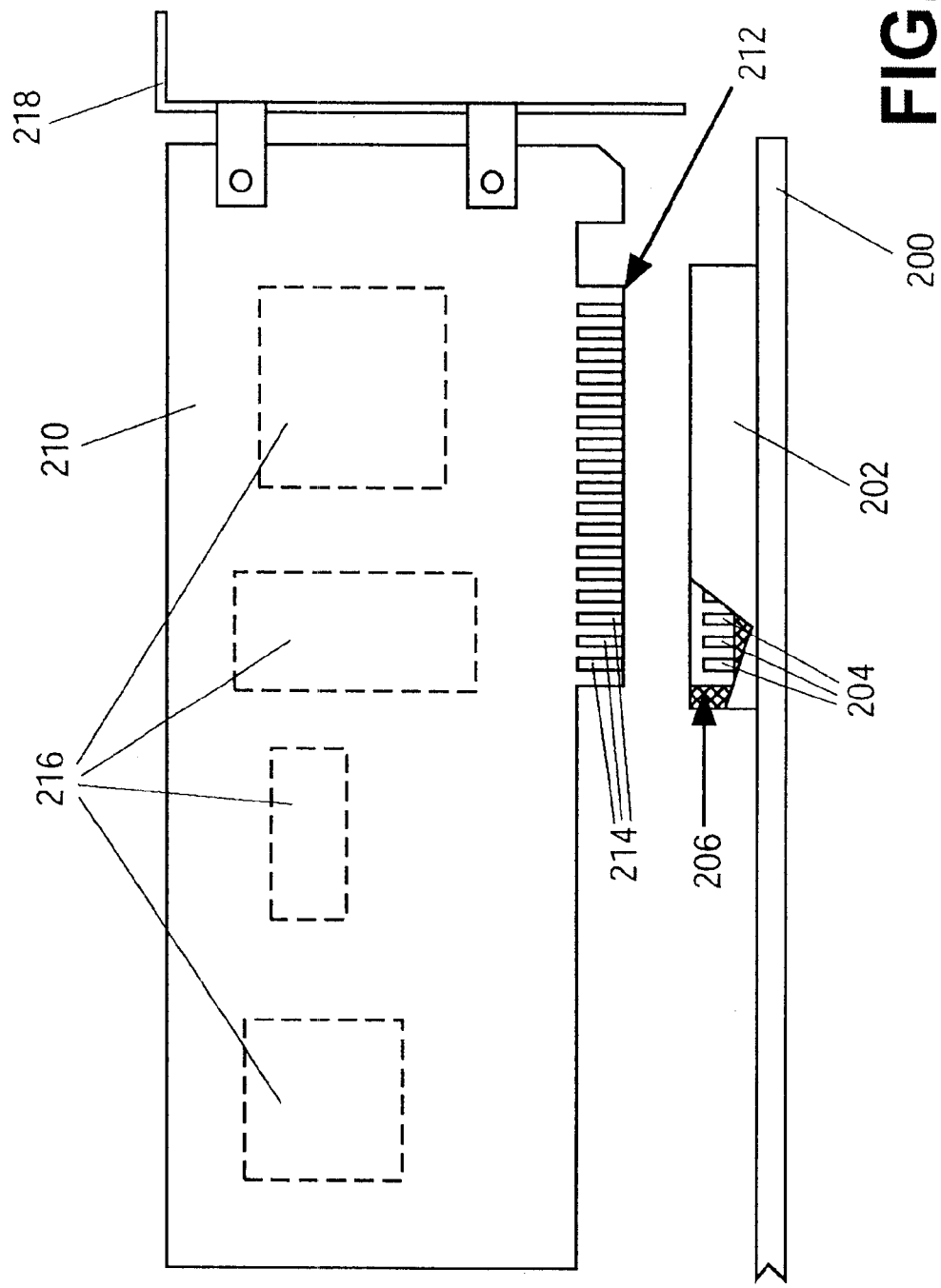
FIG. 11 is a side plan view of a peripheral card adjacent a substrate having a slot prior to the insertion of the peripheral card into the substrate slot, as known in the art.
Figure 12:
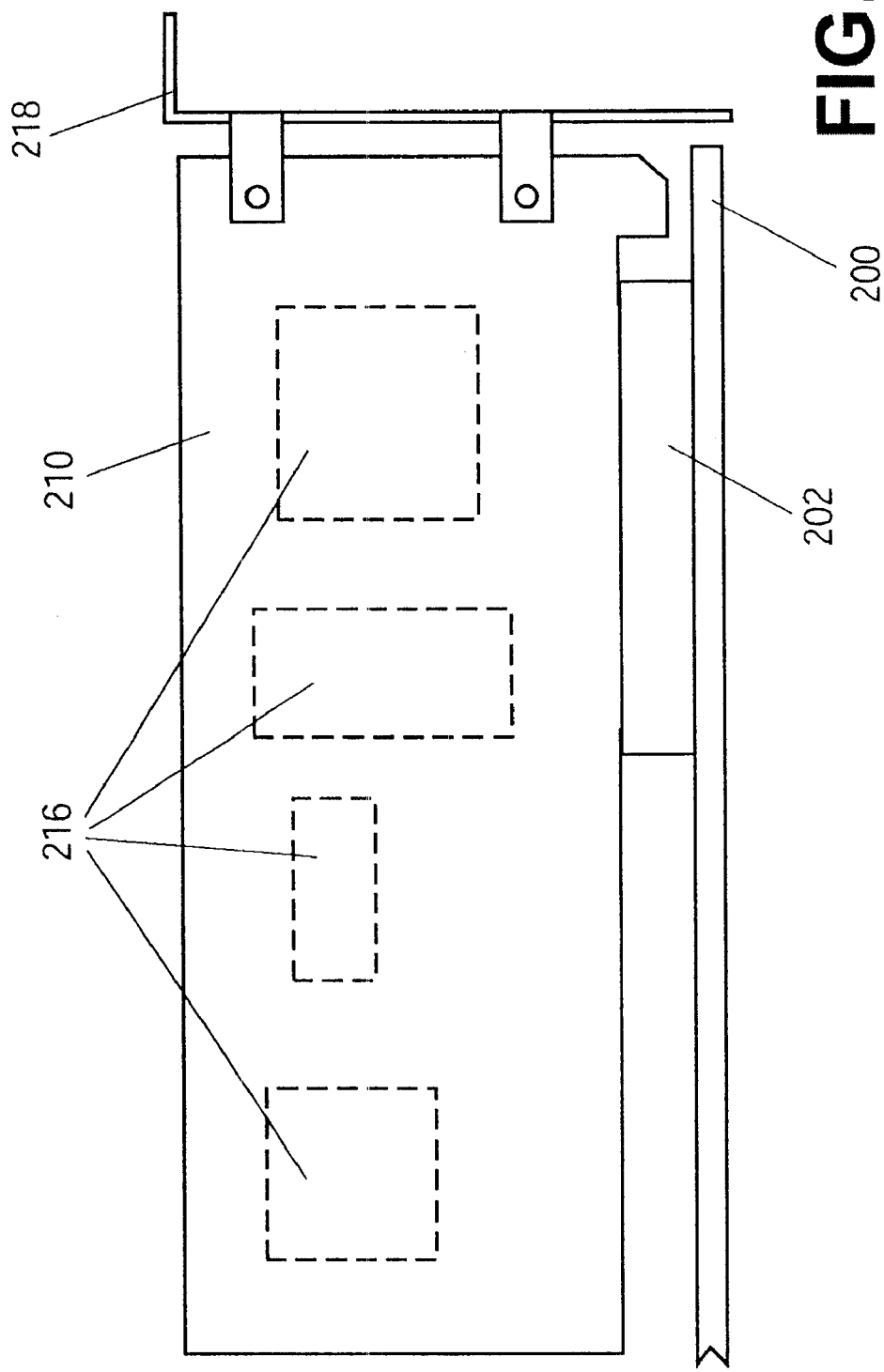
FIG. 12 is a side plan view of the peripheral card of FIG. 7 after insertion into the substrate slot, as known in the art.

FIG. 10 illustrates a schematic of the card actuator near the closed position. The angle between the lever arm 106 in this position and a closed position is about 16.063 degrees. The angle between the second rod 118 in this position and the closed position is about 10 degrees (i.e., halfway between an open and closed position). The force that is being translated to a peripheral card may be estimated by the same equations above. Thus, for a force input of 14 $lb_f$ perpendicular to the lever arm 106, an angle "a" of 16.03 degrees, and an angle "t" of 10 degrees:

Fy=(14 lb$_f$/sin (16.03 degrees))/sin (10 degrees)

Fy=294 lb$_f$

Thus, 294 lb$_f$ would be imparted on a peripheral card to seat it in a slot near the closed position, just before the force imparted goes to zero in the closed position.

It is, of course, understood that the present invention is not limited by to only insertion of periphery cards into a motherboard slot. The present invention may be adapted to any situation where a force is needed only for a predetermine distance and must end such force at the end of the predetermined distance.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An actuator, comprising:

a housing;

a movable frame movably engaging said housing;

a lever arm pivotally engaging said housing, said lever arm adapted to move between an open position and a closed position;

a first rod having a first end and a second end, said first rod first end pivotally engaging said lever arm:

a second rod having a first end and a second end, said second rod first end pivotally engaging said first rod second end and said second rod first end pivotally engaging said housing;

a third rod having a first end and a second end, said third rod first end pivotally engaging said first rod second end and said third rod second end pivotally engaging said movable frame.

2. The actuator of claim 1, wherein said lever arm in said open position orients said first rod, said second rod, and said third rod into positions which places said movable frame in a first position relative to said housing; and wherein said lever arm in said closed position orients said first rod, said second rod, and said third rods into positions which place said movable frame in a second position relative to said housing.

3. The actuator of claim 1, further including a peripheral card retainer attached to said movable frame.

4. The actuator of claim 1, further including at least one mounting mechanism on said movable frame.

5. The actuator of claim 4, further including a peripheral card retainer attached to said movable frame by said at least one mounting mechanism.

6. The actuator of claim 1, further including a spring attached to said housing and said movable frame.

7. The actuator of claim 6, wherein said spring biases said movable frame toward said housing.

8. The actuator of claim 6, wherein said spring is adapted to return said level arm from said closed position to said open position.

9. A method of fabricating an actuator, comprising:

providing a housing;

providing a movable frame movably engaging said housing;

pivotally attaching a lever arm to said housing;

pivotally attaching a first end of a first rod to said lever arm;

pivotally attaching a first end of a second rod to a second end of said first rod;

pivotally attaching a second end of said second rod to said housing;

pivotally attaching a first end of a third rod to said first rod second end; and to pivotally attaching said second end of said third rod to said movable frame.

10. The method of claim 9, wherein pivotally attaching said lever arm to said housing further includes pivotally attaching said lever arm to said housing to operate between an open position and a closed position.

11. The method of claim 9, further including attaching a peripheral card retainer attached to said movable frame.

12. The method of claim 9, further including providing at least one mounting mechanism on said movable frame.

13. The method of claim 12, further including attaching a peripheral card retainer to said movable frame by said at least one mounting mechanism.

14. The method of claim 9, further including biasing said movable frame to move toward said housing.

15. The method of claim 14, wherein said biasing said movable frame to move toward said housing comprises attaching a spring to said housing and said movable frame.

16. The method of claim 14, wherein said biasing said movable frame to move toward said housing further moves said level arm from a closed position to an open position.

17. A method of seating a peripheral card in a slot, comprising:

providing an actuator comprising:

a housing;

a movable frame movably engaging said housing;

a lever arm pivotally engaging said housing, said lever arm adapted to move between an open position and a closed position;

a first rod having a first end and a second end, said first rod first end pivotally engaging the lever arm:

a second rod having a first end and a second end, said second rod first end pivotally engaging said first rod second end and said second rod first end pivotally engaging said housing;

a third rod having a first end and a second end, said third rod first end pivotally engaging said first rod second end and said third rod second end pivotally engaging said movable frame;

providing motherboard having a peripheral slot attached thereto;

attaching a peripheral card to said movable frame while said lever aim is in said open position;

aligning said motherboard peripheral slot to said peripheral card;

moving said level arm to said closed position to seat said peripheral card in said motherboard slot; and releasing said peripheral card from said movable frame.

18. The method of claim 17, wherein said lever arm in said open position orients said first rod, said second rod, and said third rod into positions which places said movable frame in a first position relative to said housing; and wherein said lever arm in said closed position orients said first rod, said second rod, and said third rods into positions which place said movable frame in a second position relative to said housing.

19. The method of claim 17, wherein attaching said peripheral card to said movable frame comprises providing a peripheral card retainer attached to said movable frame and attaching said peripheral card to said peripheral card retainer.

20. The method of claim 19, wherein providing said peripheral card retainer comprises providing at least one mounting mechanism on said movable frame and attaching said peripheral card retainer with said mounting mechanism.

21. The method of claim 17, further including biasing said movable frame to move toward said housing.

22. The method of claim 21, wherein said biasing said movable frame to move toward said housing comprises attaching a spring to said housing and said movable frame.

23. The method of claim 21, wherein said biasing said movable frame to move toward said housing further moves said level arm from a closed position to an open position.

* * * * *

UNITED STATES PATENT AND TRADEMARK OFFICE
CERTIFICATE OF CORRECTION

PATENT NO.    : 6,315,586 B1
DATED         : November 13, 2001
INVENTOR(S)   : Joyce et al.

It is certified that error appears in the above-identified patent and that said Letters Patent is hereby corrected as shown below:

Column 2,
Line 63, delete "cain", insert -- can --.

Column 3,
Line 6, delete "level", insert -- lever --.

Column 4,
Line 21, delete "aim", insert -- arm --.

Column 6,
Line 5, before "pivotally", delete "to".

Signed and Sealed this

Eighteenth Day of June, 2002

Attest:

Attesting Officer

JAMES E. ROGAN
Director of the United States Patent and Trademark Office